United States Patent [19]

Sako et al.

[11] Patent Number: 4,750,178

[45] Date of Patent: Jun. 7, 1988

[54] ERROR CORRECTION METHOD

[75] Inventors: Yoichiro Sako; Shinichi Yamamura; Masayuki Arai, all of Tokyo, Japan

[73] Assignee: Sony Corporation, Tokyo, Japan

[21] Appl. No.: 850,109

[22] Filed: Apr. 10, 1986

[30] Foreign Application Priority Data

Apr. 13, 1985 [JP] Japan ................................. 60-78881
Apr. 13, 1985 [JP] Japan ................................. 60-78882

[51] Int. Cl.$^4$ ............................................. G06F 11/10
[52] U.S. Cl. ......................................... 371/37; 371/38
[58] Field of Search ................... 371/13, 37, 38, 39, 371/40

[56] References Cited

U.S. PATENT DOCUMENTS

| | | | |
|---|---|---|---|
| Re. 31,666 | 9/1984 | Doi et al. | 371/45 |
| 3,878,333 | 4/1975 | Shimizu et al. | 178/23 A |
| 4,306,305 | 12/1981 | Doi et al. | 371/38 |
| 4,382,300 | 5/1983 | Gupta | 371/37 |
| 4,398,292 | 8/1983 | Doi | 371/39 |
| 4,551,839 | 11/1985 | Botrel et al. | 371/35 |
| 4,593,394 | 6/1986 | Tomimitsu | 371/38 X |
| 4,630,272 | 12/1986 | Fukami | 371/37 |

Primary Examiner—Jerry Smith
Assistant Examiner—Robert W. Beausoliel
Attorney, Agent, or Firm—Hill, Van Santen, Steadman & Simpson

[57] ABSTRACT

In an error correcting method for a block of data having first and second error correction codes based on first and second series of symbols within the data block, error correction is performed repeatedly by alternately using the first and second code series, to achieve the maximum error correcting capability, without reference to the result of a previous error correction using the other series.

5 Claims, 3 Drawing Sheets

ERROR CORRECTION METHOD

BACKGROUND

Field of the Invention

The present invention relates to a method of correcting errors in digital data and more particularly to a method suitable for use in cases where interpolation is not appropriate.

When reading data from a storage device such as an optical disk, a magneto-optical disk, or the like, several idle periods of operation are observed. One such period is the period preceding reading out of a signal from the storage device, and another period is a waiting time during which the storage device waits for an instruction from a host computer, for example. Both of these periods constitute idle periods, and their frequency and duration varies with the operations being performed.

While it has been proposed to perform error correction during these idle times, the error correcting process proposed in the past has been for a fixed time only, so that it may be stopped prematurely, before all errors have been connected.

In connection with reading data from compact disks, the CIRC correction code is used as an error correction code, such CIRC code consisting of a combination of a cross-interleaving and Reed Solomon codes. In the CIRC correction code, each symbol of the data is included in two series of error correction codes, referred to as the $C_1$ series and the $C_2$ series. Coding is first performed in the $C_2$ series, and then an interleaving process is carried out with the further coding being executed in the $C_1$ series. For the decoding, the inverse operation is performed, with decoding being performed in the $C_1$ series, then the deinterleaving process is executed, and further decoding is carried out in the $C_2$ series. In the case of the CIRC correction code, greater numbers of errors can be corrected by executing the error correcting process repetitively, using the $C_1$ and $C_2$ series.

When the CIRC operation is used, a pointer is used for decoding the $C_2$ series which indicates the state of the error formed due to decoding in the $C_1$ series. Thus, the operation of the decoding in the $C_2$ series is carried on in accordance with the number of pointers developed in the $C_1$ series, or whether the pointer is set at an error location obtained by the decoding in the $C_1$ series. In other words, an indication is provided as to whether a single symbol error is corrected, a two symbol error is corrected, or where no error correcting has taken place. The pointer is necessary in order to reduce errors at the time of the correction.

In the conventional error correcting method, the error correcting process is stopped after a fixed time, even though more time remains during an idle period. However, with an increase in the number of repetitions of the correcting process, the error correcting capability can be more fully utilized.

In addition, in the conventional error correcting method, a relatively long time is required to read the pointer, which is nearly as long as the time required to read out the symbol of the code series from the storage device. This serves to reduce the amount of time during which error correction can take place. Also, an additional circuit is required in order to determine the number of pointers which are needed, since the correcting method in the second coding series is altered in dependence on the number of pointers which are included in the first code series.

BRIEF SUMMARY OF THE INVENTION

It is a principal object of the present invention to provide an error correcting method in which an error correcting capability is improved by repeatedly executing the correcting process as many times as possible during idle periods of operation.

Another object of the present invention is to provide an error correcting method which does not require the use of a pointer to indicate a symbol error, and does not require any hardware associated with such a pointer.

The above objects are achieved in the present invention by controlling the number of repetitions of the error correcting process, in accordance with the time which can be allotted thereto. In addition, the errors which are corrected in each respective series are corrected mutually independently, without need to refer to pointers set during processing of another series.

These and other objects and advantages of the present invention will become apparent from the following description and claims, and with reference to the accompaning drawings.

DETAILED DESCRIPTION OF THE PREFERRED EMBODIMENT

A preferred embodiment of the present invention will be described in connection with its use with an optical disk storage device or a magneto-optical disk storage device, for correction of errors in data read from such disk.

Figure 1:
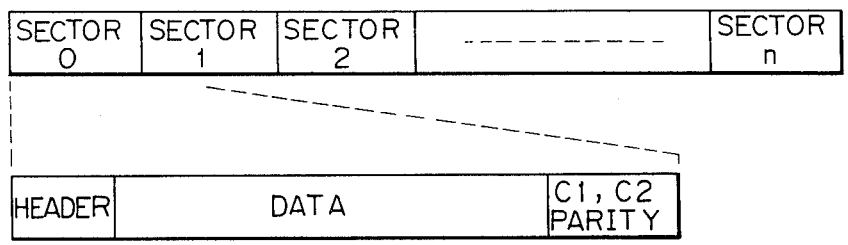
FIG. 1 is a functional diagram showing the recording format of a signal which is recorded in each sector of a storage device, such as a disk type storage device.

FIG. 1 illustrates the format of digital signals recorded in each data sector on the disk recording medium. The sectors are recorded in series, and each sector incorporates a header which includes a synchronizing signal, an address signal, and the like. Following the header, the data area is provided, and at the end of the data area, a parity area is provided with parity codes $C_1$ and $C_2$.

Figure 2:
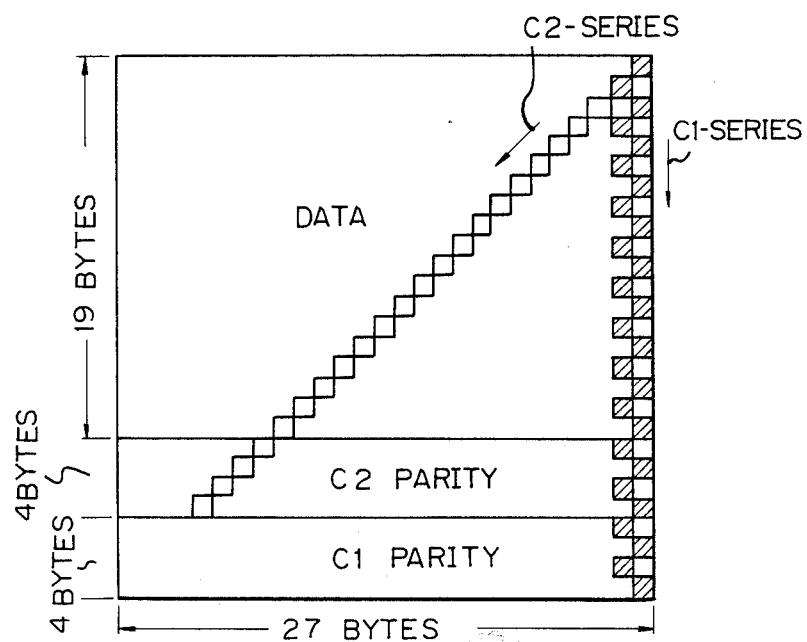
FIG. 2 is a diagram illustrating operation of the error correction method, showing the production of a series of respective error correction codes for the data recorded in each sector.

FIG. 2 illustrates the relationship of error correction code series $C_1$ and $C_2$, which produce the respective parity codes for the data which is recorded in each sector. In the example FIG. 2, one symbol of the data consists of one byte. Where the digital data is made up of a total of 513 bytes (19 bytes×27 bytes), one byte indicates the sector number, and 512 bytes represent recorded data. These bytes are shown in a two dimensional arrangement in FIG. 2 in a 19×27 rectangle. The $C_1$ series of parity codes are developed relative to the vertical dimension of the rectangle, and the $C_2$ series of parity codes are developed in an oblique direction as illustrated in FIG. 2.

The $C_2$ parity code consists of four bytes, formed as the sum of 19 bytes of the data, taken in the oblique direction as shown in FIG. 2. For example, (23, 19) Reed Solomon code is used for the $C_2$ parity.

Similarly, the $C_1$ parity consists of four bytes produced from data consisting of the 19 bytes of the 19×27 rectangle and four bytes of the $C_2$ parity. For example, (27, 23) Reed Solomon code is used for the $C_1$ parity. The $C_1$ parity is taken in a zig-zag arrangement, as illustrated in FIG. 2, indicating that it has been subjected to an interleaving process.

As described above, the parities of 216 bytes (4×27) for the $C_1$ series and (4×27) for the $C_2$ series are added to the data of 513 bytes, and the header constitutes an additional 104 bytes, making a total of 833 bytes recorded as each sector on the recording medium.

Figure 3:
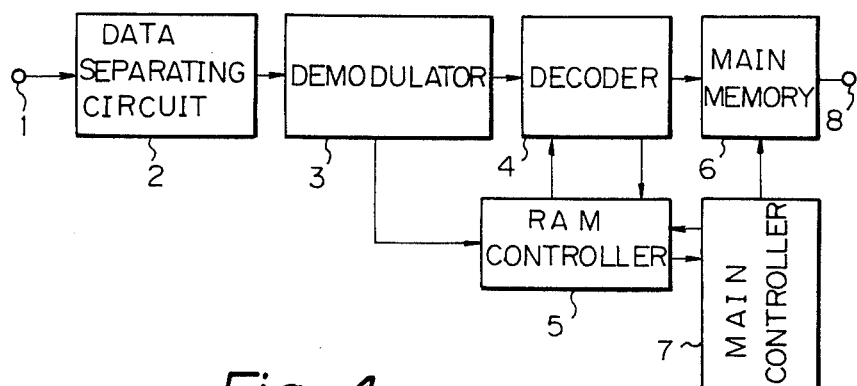
FIG. 3 is a functional block diagram of a signal reproducing circuit which performs the error correcting process of the present invention, in connection with a disk type disk storage device.

FIG. 3 illustrates apparatus for reproducing a signal from the storage disk. A signal read from the disk at terminal 1 is supplied to the input of a data separating circuit 2 which shapes the waveform of the signal and separates the data, and forwards the data to a demodulator 3. The demodulator 3 demodulates the data which, during the recording process, was subjected to the digital modulation such as EFM modulation (Eight-Fourteen Modulation) or the like. The output of the demodulator 3 is supplied to the input of a decoder 4 which performs the error correcting process. A RAM controller 5 generates a control signal and an address signal and supplies these signals to the decoder 4. The address signal addresses a RAM which is included within the decoder 4. The decoder 4 executes the de-interleaving, using the signal supplied by the RAM controller 5. Error information is supplied from the decoder 4 to the RAM controller 5, such information indicating an error location, an error size or value, and the state of an error. The RAM controller 5 responds to the information received from the decoder 4, and controls the RAM within the decoder 4, and reads out data which is identified as having an error.

A main memory 6 is connected to an output of the decoder 4, and the decoder supplies to the main memory the data which was subjected to the error correcting process. A main controller 7 supplies a control signal to the main memory. Data read out from the main memory is made available at an output terminal 8. The main controller 7 supplies a data request signal to the RAM controller 5 and in response to this data request signal, the decoded data stored in the main memory 6 is read out and made available at the terminal 8.

A data re-sending request signal may be supplied from the RAM controller 5 to the main controller 7. This signal is generated in the case where the error correction cannot be executed with the data as received. When the main controller 7 receives the data re-sending request signal, it controls the position of the read head or the like of the disk storage device and again reads or reproduces the data recorded in the same sector, making this available at input terminal 1.

Figure 4:
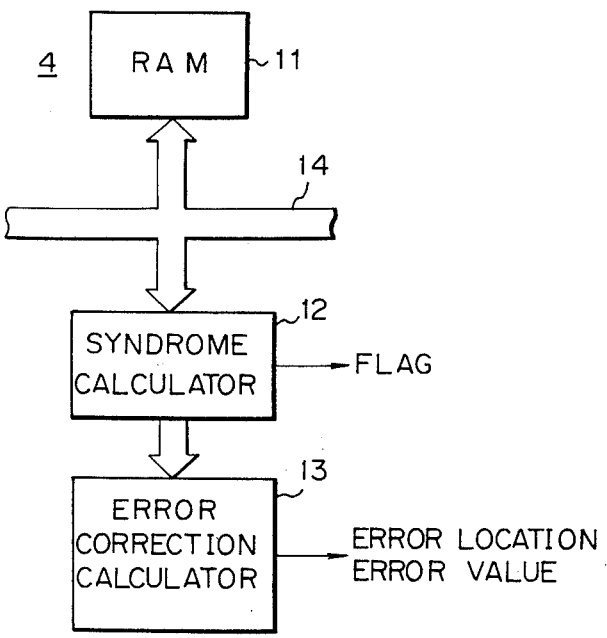
FIG. 4 is a functional block diagram of a decoder for performing error correction.

FIG. 4 illustrates the structure of the decoder 4 which performs the error correction process. A RAM 11 is provided, which stores a signal consisting of 729 bytes (27×27), consisting of the data and parity bytes recorded in each sector of the disk storage device. A common data bus 14 is provided and the RAM 11 and a syndrome calculator 12 are each connected to the bus 14. An error correction calculator 13 is connected to the syndrome calculator 12.

In the embodiment described, Reed Solomon code is used as the error correction code. The syndrome calculator 12 employs the Chien algorithm for the syndrome calculation and for the error correcting calculation based on the syndrome. The Chien algorithm has been described in detail in R. T. Chien, "Cyclic Decoding Procedure for Bose-Chaudhuri-Hocquenghem Codes", IEEE Transactions, IT-10, pp. 357-363, 1964.

The syndrome calculator 12 executes a multiplication of the data of the $C_1$ series or the $C_2$ series read out from the RAM 11, with a preset parity check matrix, so that four syndromes $S_0$, $S_1$, $S_2$, $S_3$ are produced. The quantities A, B and C in the following expressions are obtained from the four syndromes, respectively.

$$A = S_0 S_2 + S_1^2$$

$$B = S_1 S_2 + S_0 S_3$$

$$C = S_1 S_3 + S_2^2$$

The syndrome calculator 12 inspects the state of the quantities A, B and C to determine the state of the error. In the case of no error:

$$S_0 = 0, S_3 = 0, A = B = C = 0$$

In the case of one error:

$$S_0 \neq 0, S_3 \neq 0, A = B = C = 0$$

In the case of two errors:

$$A \neq 0, B \neq 0, C \neq 0$$

In the case of three or more errors a different series of outputs is produced.

In the above example, it has been assumed that one or two errors can be corrected in the $C_1$ or $C_2$ errors. The syndrome calculator 12 (FIG. 4) generates a flag indicating the state of the error. The syndromes formed by the calculator 12 are supplied to the error correction calculator 13. The error correction is carried out by the calculator 13 by obtaining the error location and the error value. The algorithm used for the correcting calculation is the same one used in the familar digital audio disk reproducing apparatus.

The error location and error value produced by the calculator 13 are used for the correcting calculation and are also supplied to the RAM controller 5.

The error correcting process of the present invention will now be described. The data of the $C_1$ series is read out from the RAM 11 and is subjected to the error correction by the syndrome calculator 12 and the error correction calculator 13. If necessary, the $C_2$ series, having been subjected to the deinterleaving process, is read out from the RAM 11 and is error corrected by the calculators 12 and 13.

By repeatedly executing the error correcting process using the $C_1$ series and the $C_2$ series, the number of symbols which can be corrected increases. The sequence of operations performed during the decoding operation will be described with reference to FIG. 5.

Figure 5:
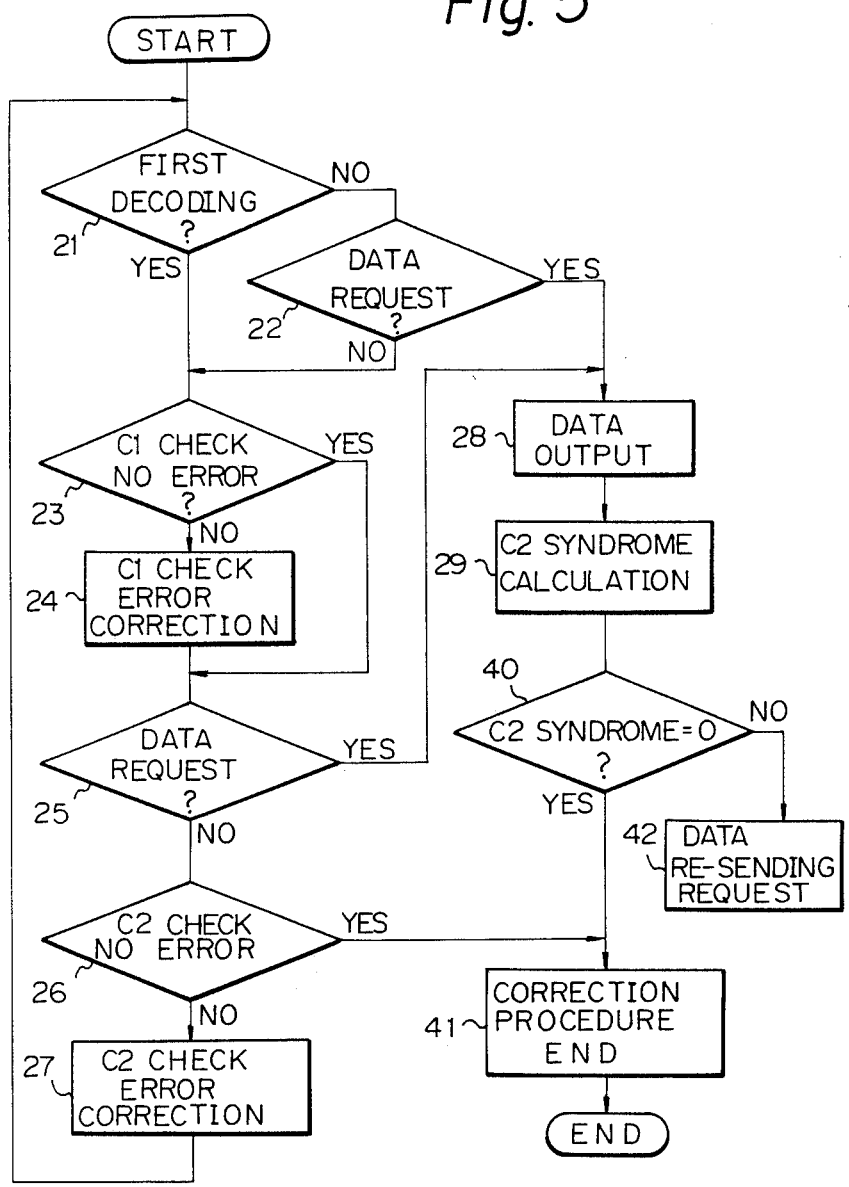
FIG. 5 is a flowchart of the error correcting method of the present invention.

The steps illustrated in the flowchart of FIG. 5 are performed under the control of the RAM controller 5. When the sequence of FIG. 5 receives control, a check is first made by unit 21 to determine whether this is the first decoding or not. If not, then a check is made by unit 22 to determine if a data request signal has been received. Such a data request signal is supplied from the main controller 7 to the RAM controller 5. If a data request signal has been received, the digital data, after completion of the error correction, is read out from the RAM 11 and the decoder 4 and stored in the main memory 6.

When unit 21 determines that the first decoding has already taken place, then control passes to unit 23, and the $C_1$ decoding is carried out, by reading out the syndrome of the $C_1$ series, from the RAM 11 to the syndrome calculator 12, and then a check is made to determine whether or not an error has been detected. All of these functions are carried out by unit 23.

If an error is detected by the unit 23, then control passes to a unit 24, and error correcting for the $C_1$ series is performed. Then control passes to the unit 25. If no error is detected by the unit 23, then control passes directly to unit 25.

Unit 25 determines whether a data request signal has been received. If not, unit 26 receives control and the $C_2$ series is processed for error correction. This involves reading out the $C_2$ series from the RAM 11 to the syndrome calculator 12, and after operation of the calculators 12 and 13, checking to see whether an error is detected. If an error is detected, control passes to a unit 27, which performs the error correction on the $C_2$ series. If the unit 26 determines that no error has occurred, then the correcting operation of unit 27 is not executed.

When the error correction is completely by unit 27, control returns to unit 21, and the above sequence is repeated.

If a data request signal is identified by units 22 or 25, then control passes to unit 28 which sends the data in response to the received data request. Thus, the data, after completion of error correction, is sent to the main memory 6, from the RAM 11 within the decoder 4. After the data is read out from the RAM 11, unit 29 receives control which calculates the syndrome for the $C_2$ series, and then unit 40 receives control to determine if the calculated syndrome is 0. The $C_1$ series may optionally also be used in this calculation if desired. If the unit 40 determines that no error has been detected, with the syndrome being equal to 0, then the current data may be handled as the effective data. Unit 41 receives control to finish the correcting operation, and pass control on to another sequence. If unit 40 determines that an error has occurred, then the data is invalidated and unit 42 receives control to cause the RAM controller 5 to issue a re-send request signal to the main controller 7. In response to the re-send request, the data is again read out from the same sector on the disk, and the procedure is repeated.

After the error check-correcting operation has been performed with the $C_1$ series and the $C_2$ series once, then further error detecting and correcting operations are carried out in connection with the $C_1$ and $C_2$ series repeatedly during the entire time available until a data request signal is been received. This gives the maximum chance of finding and correcting all errors by the time a data request is received, so that error free data can be supplied in response to such request.

In an optional modification of the embodiment described above, the b-adjacent code or the like may be used instead of the Reed Solomon code. Also, although two series of respectively vertical and oblique directions have been described in connection with FIG. 2, for the $C_1$ and $C_2$ series, other directions may be substituted if desired.

In addition, if it is determined that no errors are detected in the data in the operation of decoding the first series, then the data may be accepted without performing decoding of the other series.

The process of the present invention is performed by repeatedly using the $C_1$ and $C_2$ series, individually, without referring to the result of the error correction of the other series. Thus the error correcting processes are carried out mutually independently, and the process is not delayed by having to deal with pointers set by preceding process.

It will be apparent to those skilled in the art that various modifications and additions may be made in the method of the present invention without departing from the essential features of novelty thereof, which are intended to be defined and secured by the appended claims.

What is claimed is:

1. An error correcting mehod for a data block made up of a predetermined number of symbols, in which a first and a second series of error correcting codes are added to said data, the method comprising the steps of;
    performing an error correcting process repeatedly correcting said data by use of said first and second series of error correcting codes,
    checking for error existence during performance of said error correcting process, using said first and second series of error correcting codes,
    detecting the occurance of a data request signal for requesting the error-corrected data, and
    terminating execution of the error correcting process when a predetermined condition is satisfied, said condition being realized when no error is detected by said error checking step before said data request signal is received or when said data request signal is received even though said error correcting process is in operation.

2. The method according to claim 1, including the step of alternately using said first and second code series, respectively, in said error correcting process.

3. The method according to claim 2, includidng the step of performing said correcting of data using each of said series without using the result of a previous error correction as input information.

4. The method according to claim 1, including the step of issuing a request for a new supply of said data in response to detection of an error during performance of said error correcting process.

5. The method according to claim 1, wherein said error correcting process is executed at least once using either said first or second code series.

* * * * *